United States Patent
Asada et al.

(10) Patent No.: US 9,859,414 B2
(45) Date of Patent: Jan. 2, 2018

(54) SEMICONDUCTOR DEVICE

(71) Applicant: Shindengen Electric Manufacturing Co., Ltd., Tokyo (JP)

(72) Inventors: Takeshi Asada, Hanno (JP); Mizue Kitada, Hanno (JP); Takeshi Yamaguchi, Hanno (JP); Noriaki Suzuki, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 14/774,125

(22) PCT Filed: Mar. 31, 2014

(86) PCT No.: PCT/JP2014/059515
§ 371 (c)(1),
(2) Date: Sep. 9, 2015

(87) PCT Pub. No.: WO2015/151185
PCT Pub. Date: Oct. 8, 2015

(65) Prior Publication Data
US 2016/0118492 A1    Apr. 28, 2016

(51) Int. Cl.
*H01L 29/768* (2006.01)
*H01L 29/78* (2006.01)
(Continued)

(52) U.S. Cl.
CPC ...... *H01L 29/7813* (2013.01); *H01L 29/0634* (2013.01); *H01L 29/0696* (2013.01); *H01L 29/0865* (2013.01); *H01L 29/1095* (2013.01); *H01L 29/7802* (2013.01); *H01L 29/7811* (2013.01)

(58) Field of Classification Search
CPC ............ H01L 29/7813; H01L 29/0696; H01L 29/0865; H01L 29/0634; H01L 29/1095; H01L 29/7811; H01L 29/7802
See application file for complete search history.

(56) References Cited

U.S. PATENT DOCUMENTS 5,998,836 A    12/1999 Williams
2006/0216896 A1    9/2006 Saito et al.
(Continued)

FOREIGN PATENT DOCUMENTS

CN    101136405    3/2008
CN    102339861    2/2012
(Continued)

OTHER PUBLICATIONS

International Search Report dated Jul. 1, 2014 for PCT/JP2014/059515.
(Continued)

*Primary Examiner* — Cuong B Nguyen
*Assistant Examiner* — Samuel Park
(74) *Attorney, Agent, or Firm* — Ladas & Parry, LLP

(57) ABSTRACT

A semiconductor device includes a drift layer 20 of a first conductivity type, a base layer 30 of a second conductivity type that is disposed on the drift layer 20 and is connected to a source electrode 90, and a column layer 50 of a second conductivity type that is connected to the source electrode 90 and penetrates the base layer 30 to extend into the drift layer 20.

7 Claims, 11 Drawing Sheets

(51) Int. Cl.
*H01L 29/06* (2006.01)
*H01L 29/08* (2006.01)
*H01L 29/10* (2006.01)

(56) References Cited

U.S. PATENT DOCUMENTS

| | | | |
|---|---|---|---|
| 2008/0048295 A1 | 2/2008 | Takahashi | |
| 2009/0294870 A1* | 12/2009 | Arai | H01L 21/823437 257/378 |
| 2011/0018029 A1* | 1/2011 | Pfirsch | H01L 29/0696 257/147 |
| 2012/0012929 A1 | 1/2012 | Saito et al. | |
| 2013/0256783 A1* | 10/2013 | Katou | H01L 29/7827 257/328 |
| 2014/0203356 A1* | 7/2014 | Kagata | H01L 29/407 257/330 |

FOREIGN PATENT DOCUMENTS

| | | |
|---|---|---|
| CN | 103828058 | 5/2014 |
| DE | 696 17 098 | 12/1996 |
| DE | 10 2007 024 113 | 8/2012 |
| EP | 0 746 030 | 12/1996 |
| JP | 9-102607 | 4/1997 |
| JP | 2006-269720 | 10/2006 |
| JP | 2008-53648 | 3/2008 |
| JP | 2012-23272 | 2/2012 |
| JP | 2013-84905 | 5/2013 |
| KR | 10-2008-0019529 | 3/2008 |
| TW | 201205780 | 2/2012 |
| WO | 2013/046537 | 4/2013 |

OTHER PUBLICATIONS

International Preliminary Report on Patentability dated Jan. 21, 2015 for PCT/JP2014/059515.
English Translation of PCT International Search Report for PCT/JP2014/059515 from WIPO dated Jul. 1, 2014.
English Translation of PCT International Preliminary Report on Patentability Chapter II for PCT/JP2014/059515 dated Jan. 21, 2015 from WIPO.
PCT International Written Opinion from PCT/JP2014/059515 dated Jan. 7, 2014, and its machine English translation from Google Translate.

* cited by examiner

SEMICONDUCTOR DEVICE

CROSS-REFERENCE TO RELATED APPLICATION(S)

This application is the U.S. National Stage of International Patent Application No. PCT/JP2014/059515 filed on Mar. 31, 2014, the disclosure of which is incorporated in its entirety herein by reference.

TECHNICAL FIELD

The present invention relates to a semiconductor device.

BACKGROUND ART

A known conventional semiconductor device includes a semiconductor substrate of a first conductivity type, a pillar layer including a first semiconductor pillar sub-layer of the first conductivity type and a second semiconductor pillar sub-layer of a second conductivity type that is formed on the semiconductor substrate and has a rectangular strip-like shape in cross section, a first main electrode electrically connected to the semiconductor substrate, a semiconductor base layer of the second conductivity type formed on a surface of the first semiconductor pillar sub-layer, a second main electrode that is directly joined to a semiconductor diffusion layer of the first conductivity type selectively formed by diffusion on a surface of the semiconductor base layer and is electrically connected to the semiconductor base layer, and a gate electrode formed, with an insulating film interposed therebetween, in a region that extends from the semiconductor diffusion layer to the first semiconductor pillar sub-layer to form a channel in the semiconductor base layer between the semiconductor diffusion layer and the first semiconductor pillar sub-layer (see FIG. 15 of Patent Literature 1, for example).

For example, if two semiconductor devices, such as the MOSFET disclosed in FIG. 15 of Patent Literature 1 described above, are used to achieve synchronous rectification, and the ratio of the input capacitance "Ciss" to the feedback capacitance "Crss" of the semiconductor devices is low, charging and discharging of the capacitances can cause the gate voltage to increase to cause malfunction and turn on a semiconductor device turned off. To solve this problem, the thickness or area of the insulating layer around the gate electrode can be adjusted to adjust the input capacitance "Ciss" and the feedback capacitance "Crss". However, such adjustment of the thickness or area of the insulating layer around the gate electrode has an influence on other characteristics, such as the threshold voltage or the withstanding voltage.

CITATION LIST

Patent Literature

Patent Literature 1: Japanese Patent Laid-Open No. 2006-269720

SUMMARY OF INVENTION

Technical Problem

The present invention has been devised in view of such circumstances and can reduce the possibility that charging and discharging of a capacitance causes a gate voltage to increase to lead to malfunction.

Means of Solving the Problem

A semiconductor device according to the present invention, comprising:
a drift layer of a first conductivity type;
a base layer of a second conductivity type that is disposed on the drift layer and is connected to a source electrode;
a column layer of a second conductivity type that is connected to the source electrode and penetrates the base layer to extend into the drift layer;
a pair of first gate electrodes surrounded by a first insulating layer disposed in a pair of first trenches provided on opposite sides of an upper end of the column layer; and
a source region of the first conductivity type that is provided in the base layer, is adjacent to the first insulating layer on a side of the first insulating layer opposite to the column layer, and is connected to the source electrode.

In the semiconductor device according to the present invention, the column layer and the drift layer repeatedly occur in a horizontal direction to form a super junction structure.

In the semiconductor device according to the present invention,
a second gate electrode surrounded by a second insulating layer that is disposed in a second trench formed in the column layer between the pair of first gate electrodes in the horizontal direction.

In the semiconductor device according to the present invention,
a plurality of column layers are provided, and
the semiconductor device according to the present invention further comprises a third gate electrode surrounded by a third insulating layer that is disposed between adjacent two of the column layers and is disposed in a third trench that extends from the source region to the drift layer.

In the semiconductor device according to the present invention, a plurality of column layers are provided, and
the semiconductor device further comprises:
a second gate electrode surrounded by a second insulating layer that is disposed in a second trench formed in the column layer between the pair of first gate electrodes in the horizontal direction; and
a third gate electrode surrounded by a third insulating layer that is disposed between adjacent two of the column layers and is disposed in a third trench that extends from the source region to the drift layer.

In the semiconductor device according to the present invention,
a plurality of second insulating layers and a plurality of second gate electrodes are provided.

In the semiconductor device according to the present invention,
a plurality of third insulating layers and a plurality of third gate electrodes are provided.

In the semiconductor device according to the present invention,
a plurality of second insulating layers and a plurality of second gate electrodes are provided, and a plurality of third insulating layers and a plurality of third gate electrodes are provided.

In the semiconductor device according to the present invention,
a side surface of the first trench on a side of the column layer is located in the column layer, and a side surface of the first trench on a side opposite to the column layer is located in the source region, the base layer and the drift layer.

Advantageous Effects of Invention

The so-called feedback capacitance "Crss" is equal to the capacitance "Cgd" between the gate potential and the drain potential, and the so-called input capacitance "Ciss" is equal to the capacitance "Cgd" between the gate potential and the drain potential plus the capacitance "Cgs" between the gate potential and the source potential. In this respect, according to the present invention, the first insulating layers surrounding the first gate electrodes that are at the gate potential are disposed on the opposite sides of the upper end of the column layer that is connected to the source electrode and is at the source potential. In addition, the first insulating layer in contact with the first gate electrode that is at the gate potential is, on the side opposite to the column layer, in contact with the source region and the base layer that are connected to the source electrode and are at the source potential. Therefore, the capacitance "Cgs" between the gate potential and the source potential can be increased without having a significant effect on the capacitance "Cgd" between the gate potential and the drain potential, and therefore, the input capacitance "Ciss" can be increased without significantly increasing the feedback capacitance "Crss". Therefore, the ratio of the input capacitance "Ciss" to the feedback capacitance "Crss" can be increased, and the possibility that charging and discharging of a capacitance cause the voltage at the gate electrode to increase to lead to malfunction can be reduced.

DESCRIPTION OF EMBODIMENTS

First Embodiment

<<Configuration>>

Figure 1:
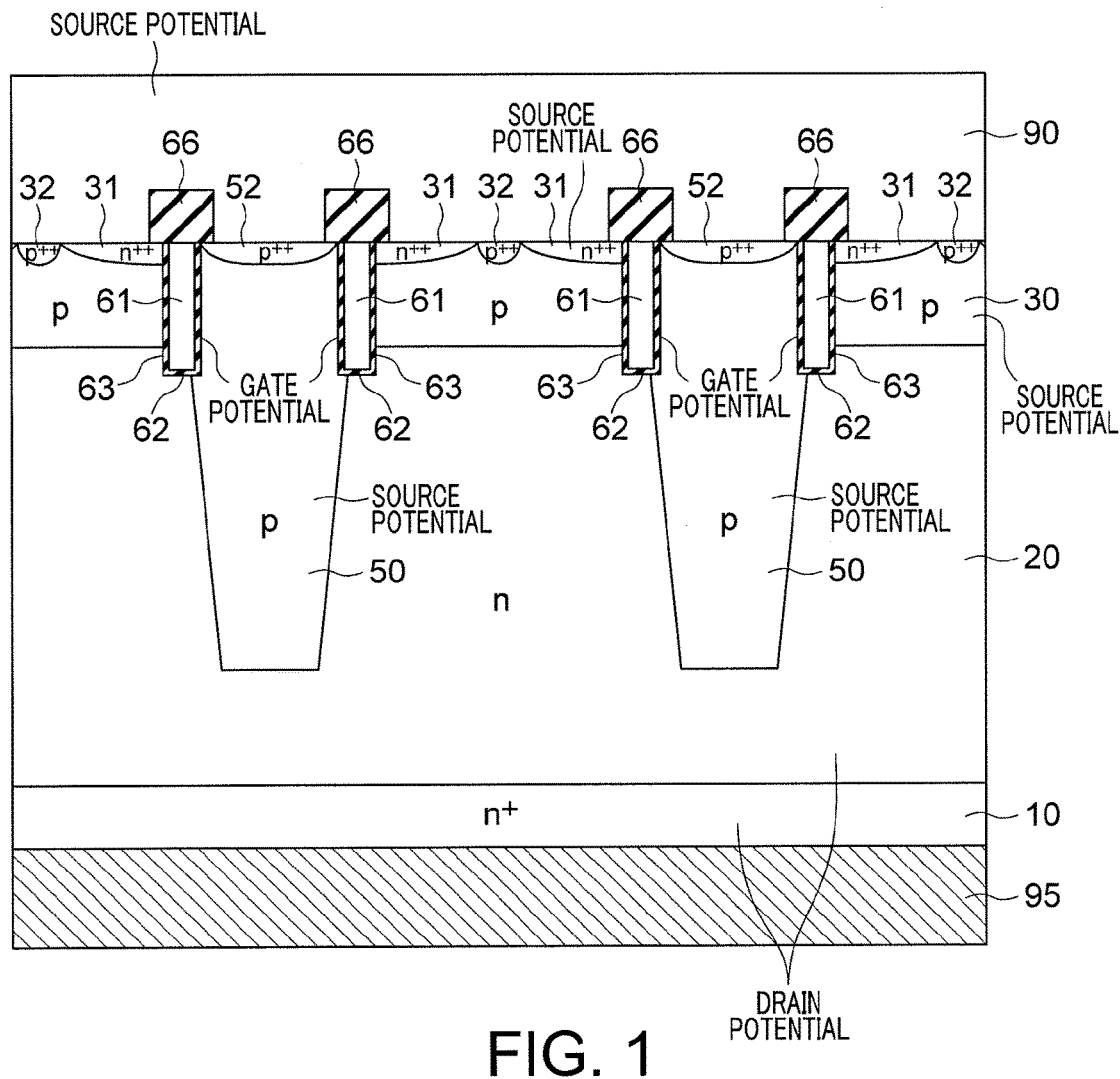
FIG. 1 is a side cross-sectional view showing a cross section of a semiconductor device according to a first embodiment of the present invention.
Figure 2:
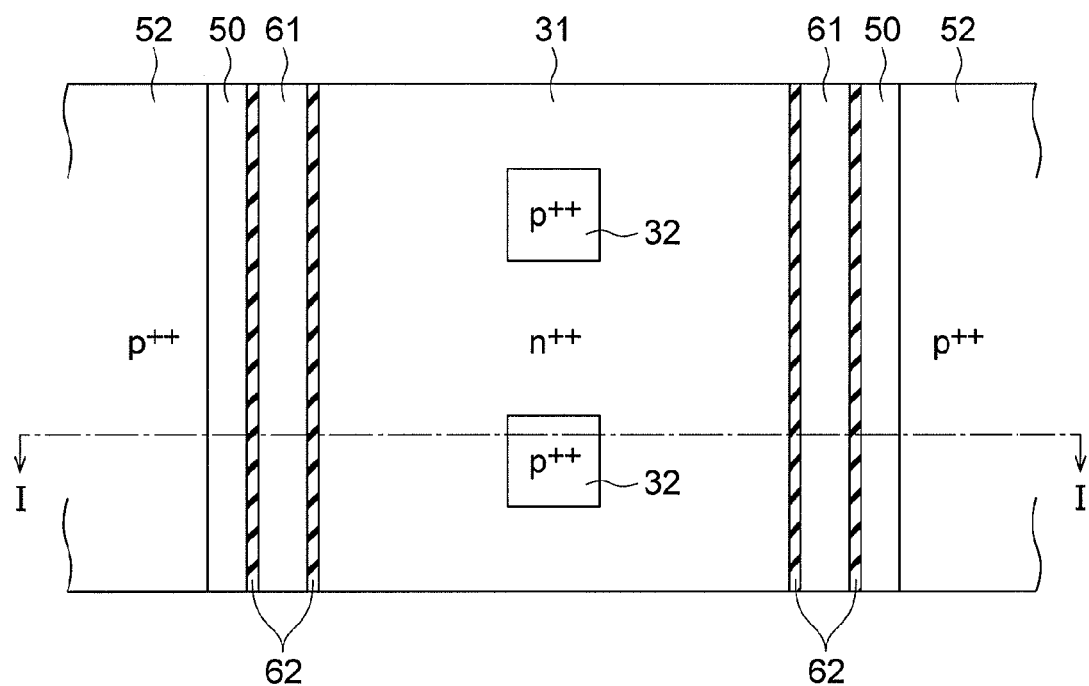
FIG. 2 is a top view of the semiconductor device according to the first embodiment of the present invention in which a source electrode and a first interlayer insulating film are omitted.
Figure 3:
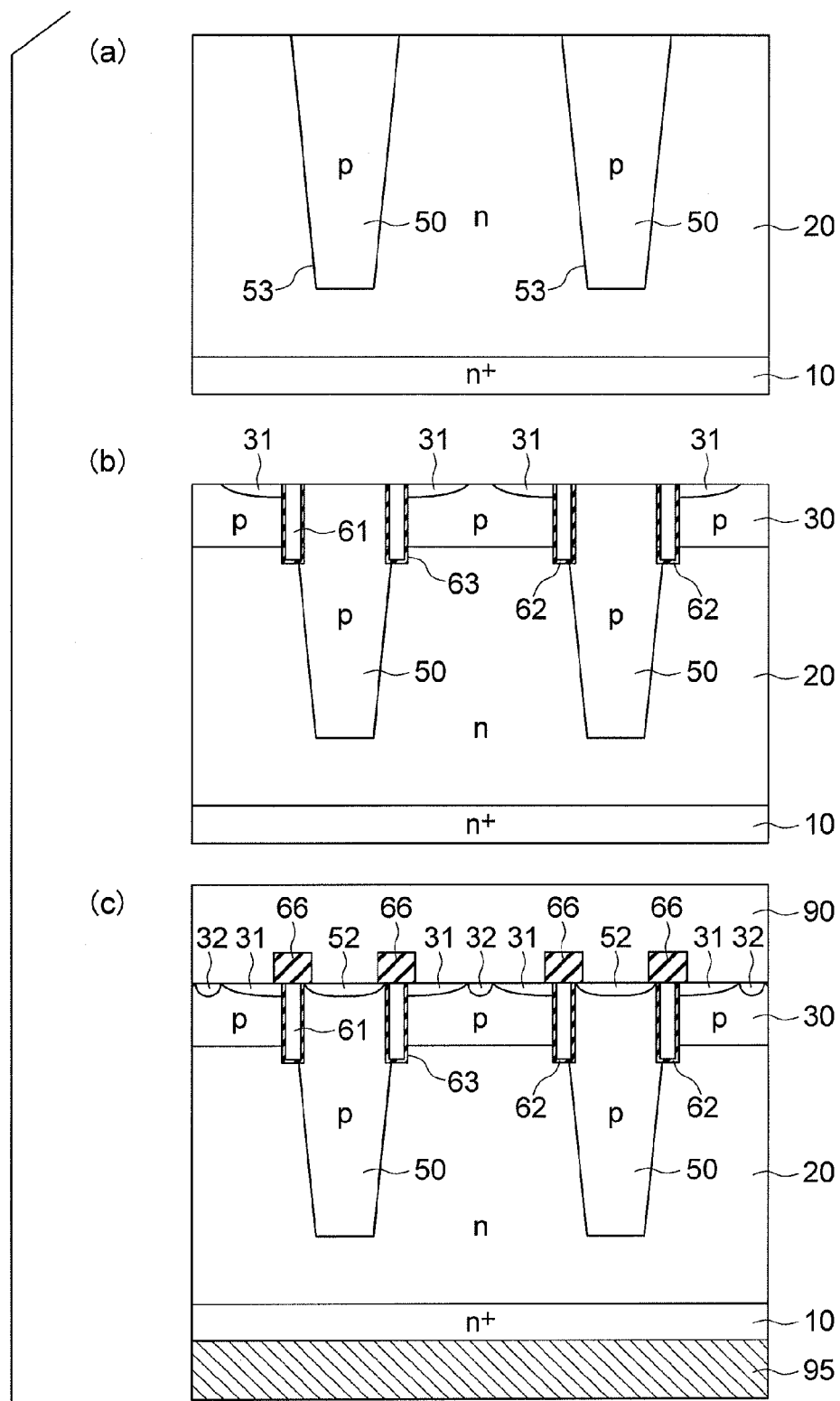
FIG. 3 is a side cross-sectional view for illustrating an example of a process of manufacturing the semiconductor device according to the first embodiment of the present invention.

In the following, a semiconductor device according to a first embodiment of the present invention will be described with reference to the drawings. FIGS. 1 to 3 are diagrams for illustrating the first embodiment of the present invention.

A semiconductor device according to this embodiment is a vertical power MOSFET, for example. In the following, the semiconductor device will be described as a vertical power MOSFET. However, note that the vertical power MOSFET is only an example of the semiconductor device.

As shown in FIG. 1, the semiconductor device according to this embodiment includes an n-type semiconductor substrate 10 of high impurity concentration (the "n-type" corresponds to a "first conductivity type" in the claims), a n-type drift layer 20 of low impurity concentration formed on the n-type semiconductor substrate of high impurity concentration, a p-type base layer 30 disposed on the drift layer 20 (the "p-type" corresponds to a "second conductivity type" in the claims), and a p-type column layer 50 that penetrates the p-type base layer 30 and extends into the n-type drift layer 20. Although this embodiment will be described with regard to an implementation in which the n-type is the "first conductivity type", and the p-type is the "second conductivity type", the present invention is not limited to the implementation, and an implementation is also possible in which the p-type is the "first conductivity type", and the n-type is the "second conductivity type".

In this embodiment, the whole of a layer that is connected to a source electrode 90 and extends to below the lower end of the base layer 30 is referred to as the column layer 50, regardless of the manufacturing method used. Therefore, even if the base layer 30 and an upper part of the column layer 50 are formed in the same process (such as when the base layer 30 and an upper part of the column layer 50 are formed by epitaxial growth or diffusion of a p-type semiconductor layer), the upper part of the column layer 50 is not referred to as the "base layer 30" but is regarded as a part of the "column layer 50".

A pair of first trenches 63 are formed on the opposite sides of an upper end of the p-type column layer 50, and a first gate electrode 61 surrounded by a first insulating layer 62 is disposed in the first trench 63. That is, according to this embodiment, a pair of first gate electrodes 61 is disposed on the opposite sides of the upper end of the p-type column layer 50, as shown in FIG. 1. The first gate electrode 61 serves as a control electrode, and a potential thereof is a gate potential.

According to this embodiment, a first interlayer insulating film 66 is formed on an upper surface of the first gate electrode 61 and the first insulating layer 62. Viewed from above, the first gate electrode 61, the first insulating layer 62 and the first interlayer insulating film 66 according to this embodiment are shaped in a striped pattern (see FIG. 2 for the pattern of the first gate electrode 61 and the first insulating layer 62). FIG. 1 shows a cross section taken along the line I-I in FIG. 2. The first insulating layer 62 and the first interlayer insulating film 66 may be made of silicon dioxide ($SiO_2$), for example.

As shown in FIG. 1, according to this embodiment, the p-type column layer 50 and the n-type drift layer 20 repeatedly occur in the horizontal direction to form a super junction structure. That is, the number of carriers in the p-type column layer 50 is equal to the number of carriers in a region of the n-type drift layer 20 between two adjacent p-type column layers 50. Viewed from above, the p-type column layer 50 is shaped in a striped pattern (see FIG. 2).

As shown in FIG. 1, an n-type source region 31 of high impurity concentration is formed in the base layer 30 at a position adjacent to an upper end of the first insulating layer 62 on the side opposite to the p-type column layer 50. As shown in FIG. 2, a p-type ohmic region 32 of higher impurity concentration than the base layer 30 is formed in a part of an upper surface of the p-type base layer 30. A p-type ohmic region 52 of higher impurity concentration than the column layer 50 is formed in an upper surface of the p-type column layer 50.

A source electrode 90, which is a first main electrode, is disposed on the n-type source region 31, the p-type ohmic region 32, the p-type ohmic region 52 and the first interlayer insulating film 66. A drain electrode 95, which is a second main electrode, is disposed on a lower surface of the n-type semiconductor substrate 10.

In this embodiment, the n-type source region 31, the p-type ohmic region 32 and the p-type ohmic region 52 are connected to the source electrode 90 and are at a source potential. Since the p-type ohmic region 32 is connected to the source electrode 90, the entire p-type base layer 30 is at the source potential. Since the p-type ohmic region 52 is connected to the source electrode 90, the entire p-type column layer 50 is at the source potential. The n-type semiconductor substrate 10 is connected to the drain electrode 95, and the n-type semiconductor substrate 10 and the n-type drift layer 20 are at a drain potential.

According to this embodiment, as shown in FIG. 1, the side surface of the first insulating layer 62 in the first trench 63 on the side of the column layer 50 is located in the column layer 50, and the side surface of the first insulating layer 62 in the first trench 63 on the side opposite to the column layer 50 is located in the source region 31, the base layer 30 and the drift layer 20. More specifically, a lower surface of the first insulating layer 62 in the first trench 63 extends across the column layer 50 and the drift layer 20, so that the side surface of the first insulating layer 62 on the side of the column layer 50 is located in the column layer 50, and the side surface of the first insulating layer 62 on the side opposite to the column layer 50 is located in the source region 31, the base layer 30 and the drift layer 20.

<<Manufacturing Method>>

Next, an example of a method of manufacturing the semiconductor device according to this embodiment will be briefly described mainly with reference to FIG. 3.

First, an n-type semiconductor layer of low impurity concentration that is to form the drift layer 20 is formed by epitaxial growth on the n-type semiconductor substrate 10 of high impurity concentration (see FIG. 3(a)). A trench 53 is then formed in a predetermined region using an etching mask (not shown). A p-type semiconductor layer that is to form a part of the column layer 50 is then formed by epitaxial growth to fill the trench 53.

The base layer 30 is then formed by masking a part of a peripheral structure region (not shown) and performing ion implantation and thermal diffusion of a p-type impurity (see FIG. 3(b)). The first trench 63 in the striped pattern is then formed on the opposite sides of the column layer 50 using an etching mask (not shown). An insulating layer (such as silicon dioxide ($SiO_2$)) that is to form the first insulating layer 62 is then formed on an inner peripheral surface of the trench. A conductive material, such as polysilicon, that is to form the first gate electrode 61 is then deposited on the insulating layer.

The source region 31 is then formed along the first trench 63 by masking a desired part and performing ion implantation of an n-type impurity. The ohmic regions 32 and are then formed by appropriately performing ion implantation of parts of the base layer 30 and the column layer 50.

The first interlayer insulating film 66 is then formed on the gate electrode 61 by forming an insulating film of silicon dioxide ($SiO_2$) or the like using LP-CVD or the like (see FIG. 3(c)). The source electrode 90 is then mounted on the upper surface of the semiconductor device. And the drain electrode 95 is mounted on the lower surface of the semiconductor device.

<<Advantageous Effects>>

Next, advantageous effects of this embodiment configured as described above that have not been described yet or are particularly important will be described.

A so-called feedback capacitance "Crss" is equal to a capacitance "Cgd" between the gate potential and the drain potential, and a so-called input capacitance "Ciss" is equal to the capacitance "Cgd" between the gate potential and the drain potential plus a capacitance "Cgs" between the gate potential and the source potential.

That is, the feedback capacitance "Crss" and the input capacitance "Ciss" are expressed as follows.

feedback capacitance $Crss=Cgd$ input capacitance $Ciss=Cgd+Cgs$.

According to this embodiment, as shown in FIG. 1, the first gate electrodes 61 at the gate potential are disposed on the opposite sides of the upper end of the column layer 50 with the first insulating layer 62 interposed therebetween, the column layer 50 being connected to the source electrode 90 via the p-type ohmic region 52 and being at the source potential. The first insulating layer 62, which is in contact with the first gate electrode 61 at the gate potential, is in contact with the source region 31 and the base layer 30 on the side opposite to the column layer 50, the source region 31 being connected to the source electrode 90 and being at the source potential, and the base layer 30 being connected to the source electrode 90 via the p-type ohmic region 32 and being at the source potential. Therefore, the capacitance "Cgs" between the gate potential and the source potential can be increased without having a significant effect on the capacitance "Cgd" between the gate potential and the drain potential, and therefore, the input capacitance "Ciss" can be increased without significantly increasing the feedback capacitance "Crss".

Figure 11:
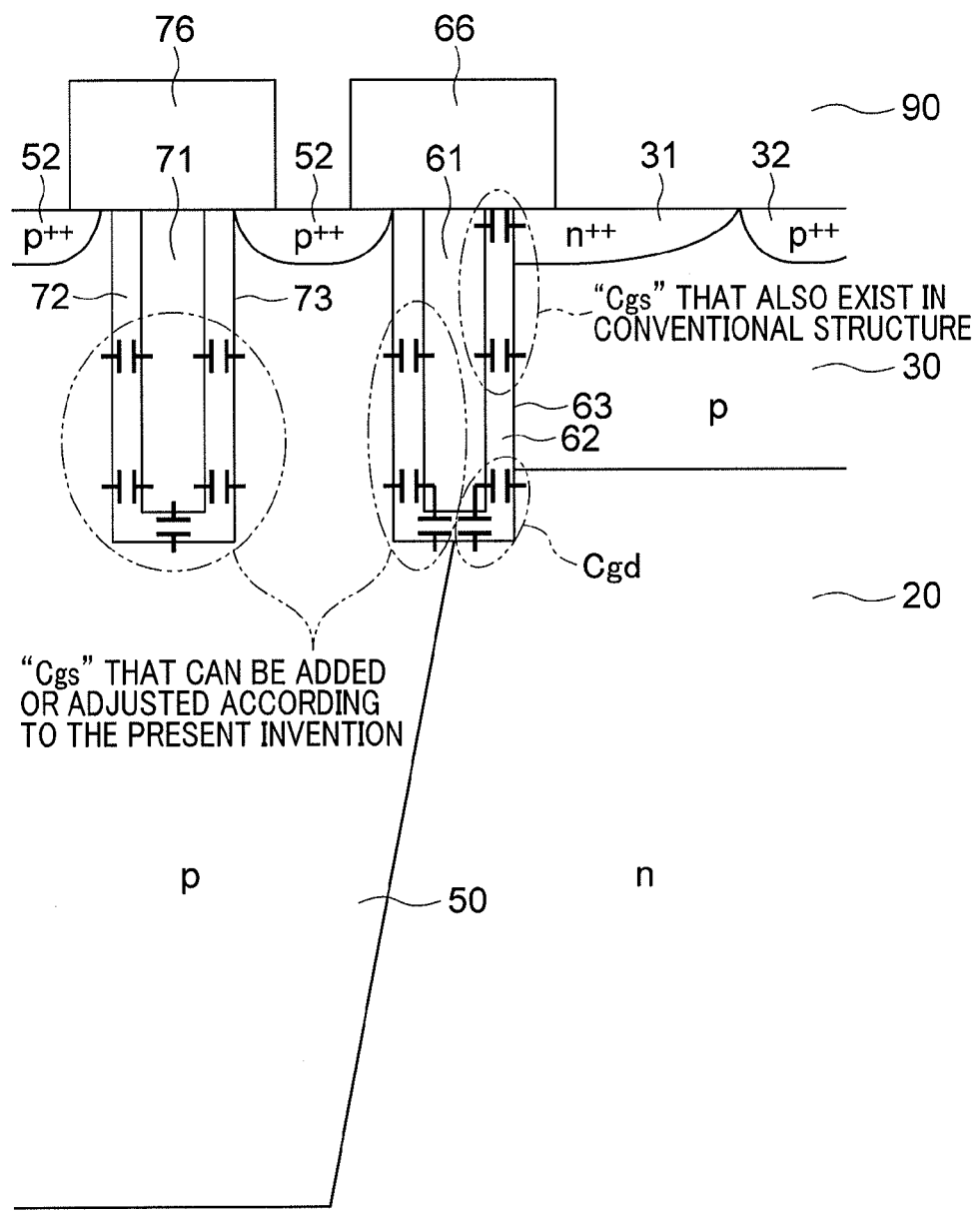
FIG. 11 is a side cross-sectional view for illustrating a capacitance "Cgd" and a capacitance "Cgs" of the semiconductor devices according to the first and second embodiments of the present invention.

This will now be described with reference to FIG. 11. According to this embodiment, since the first gate electrodes 61 at the gate potential are disposed on the opposite sides of the upper end of the column layer 50 at the source potential, the capacitance "Cgs" between the gate potential and the source potential can be provided at the first gate electrode 61 on the side of the column layer 50, so that the capacitance "Cgs" is increased. On the other hand, the capacitance "Cgd" between the gate potential and the drain potential, which increases as a result of formation of such a first gate electrode 61, is formed only between the first gate electrode 61 and the drift layer 20 at the drain potential. Therefore, the increase of the capacitance "Cgd" is smaller than the increase of the capacitance "Cgs". Thus, the capacitance "Cgs" between the gate potential and the source potential can be increased without having a significant effect on the capacitance "Cgd" between the gate potential and the drain potential, and therefore, the input capacitance "Ciss" can be increased without significantly increasing the feedback capacitance "Crss". In this way, according to this embodiment, the ratio of the input capacitance "Ciss" to the feedback capacitance "Crss" can be increased, and the possibility that charging and discharging of the capacitances cause the voltage at the first gate electrode 61 to increase to lead to malfunction can be reduced.

In this respect, if two semiconductor devices, such as the MOSFET disclosed in FIG. 15 of Patent Literature 1, are used to achieve synchronous rectification, and the ratio of the input capacitance "Ciss" to the feedback capacitance "Crss" of the semiconductor devices is low, charging and discharging of the capacitances (such as an increase of the drain potential) can cause the gate voltage to increase to cause malfunction and turn on an MOSFET turned off to produce a through-current. According to this embodiment, however, the ratio of the input capacitance "Ciss" to the feedback capacitance "Crss" can be increased, so that the possibility of such malfunction can be reduced.

Furthermore, according to this embodiment, the arrangement involving the capacitances can be easily designed. In addition, adjustment of the input capacitance "Ciss" and the feedback capacitance "Crss" does not require adjustment of the thickness or area of the insulating layer around the gate electrode and therefore has no effect on other characteristics, such as the threshold voltage or the withstanding voltage, and does not cause an increase of the on-resistance.

Furthermore, according to this embodiment, since the first insulating layers 62 are provided on the opposite sides of the upper end of the column layer 50, the impurity, such as boron, is unlikely to diffuse from the column layer 50 into the base layer 30 on the opposite side of the first trench 63 to the column layer 50. Therefore, a semiconductor device having a super junction structure constituted by a fine cell can be easily manufactured.

This will now be described. In the structure shown in FIG. 15 of Patent Literature 1, if the cell is miniaturized, the distance between the pillar layer and the gate electrode, which corresponds to the column layer 50 according to this embodiment, is very small. If the distance between the pillar layer and the gate electrode is very small, it is empirically shown that the threshold voltage can change because of the effect of the impurity, such as boron, diffused from the pillar layer. For this reason, the structure shown in FIG. 15 of Patent Literature 1 has a problem that it is difficult to miniaturize the cell. According to this embodiment, however, the first insulating layers 62 are provided on the opposite sides of the upper end of the column layer 50 as described above. As a result, the impurity, such as boron, does not diffuse from the column layer 50 and therefore has no effect on the impurity concentration of the base layer 30 located on the side opposite to the column layer 50. Therefore, even if the cell is miniaturized, the threshold voltage can be prevented from changing, and a semiconductor device, such as a vertical power MOSFET, that has a super junction structure constituted by a fine cell can be easily manufactured.

Furthermore, according to this embodiment, even if the super junction structure is adopted, a serge voltage can be prevented from occurring when a switch is turned off. This will now be described. With a device having a super junction structure, the junction capacitance "Cds" between the column layer and the drift layer is high, so that, in a switching operation, a large amount of charges is discharged, and the amount of charges abruptly changes. Therefore, the semiconductor device having a super junction structure has a problem that a serge voltage tends to occur when a switch is turned off. According to this embodiment, however, the input capacitance "Ciss" is high as described above. Therefore, when a switch is turned off, that is, when the gate voltage is set to 0 or a negative potential, the switching speed is relatively low because of the high input capacitance "Ciss", and therefore, the amount of charges can be prevented from abruptly changing. Therefore, according to this embodiment, even if the super junction structure is adopted, a serge voltage is unlikely to occur when a switch is turned off.

Second Embodiment

Next, a second embodiment of the present invention will be described mainly with reference to FIGS. 4, 5 and 11.

According to the second embodiment, in addition to the first gate electrode 61 and the first insulating layer 62 according to the first embodiment, a second gate electrode 71 surrounded by a second insulating layer 72 is provided in the column layer at an intermediate position in the horizontal direction between the pair of first gate electrodes 61. The second insulating layer 72 and the second gate electrode 71 are disposed in a second trench 73 formed in the column layer 50. The second gate electrode 71 is also at the gate potential.

In addition, according to this embodiment, a second interlayer insulating film 76 is formed on an upper surface of the second gate electrode 71 and the second insulating layer 72. Viewed from above, the second gate electrode 71, the second insulating layer 72 and the second interlayer insulating film 76 are shaped in a striped pattern.

The remainder of the configuration according to the second embodiment is substantially the same as the configuration according to the first embodiment. In the second embodiment, the same components as those in the first embodiment are denoted by the same reference numerals, and detailed descriptions thereof will be omitted.

This embodiment has advantageous effects similar to those of the first embodiment. Since the advantageous effects have already been described in detail with regard to the first embodiment, the description of the advantageous effects of this embodiment will be focused only on those specific to this embodiment.

Figure 4:
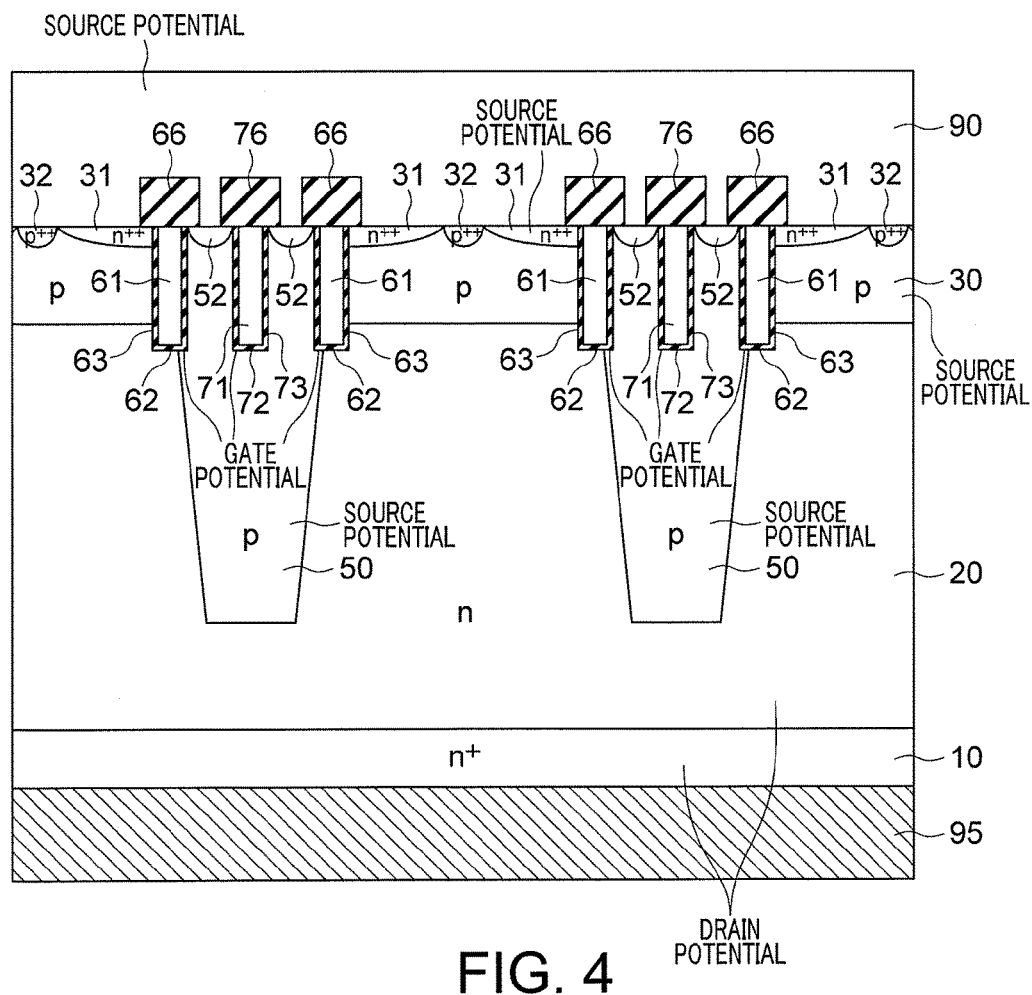
FIG. 4 is a side cross-sectional view showing a cross section of a semiconductor device according to a second embodiment of the present invention.

As shown in FIG. 4, the second gate electrode 71 that is surrounded by the second insulating layer 72 and is at the gate potential is provided in the column layer 50. As described above, the column layer 50 is connected to the source electrode 90 via the ohmic region 52 and is at the source potential. Therefore, the capacitance "Cgs" between the gate potential and the source potential can be exclusively increased by providing the second gate electrode 71 and the second insulating layer 72.

This will now be described with reference to FIG. 11. According to this embodiment, since the second gate electrode 71 at the gate potential is disposed in the column layer 50 at the source potential, the capacitance "Cgs" between the gate potential and the source potential can be provided between the column layer 50 and the second gate electrode 71, so that the capacitance "Cgs" is increased. On the other hand, even if the second gate electrode 71 is provided, the capacitance "Cgd" between the gate potential and the drain potential does not increase. Thus, the capacitance "Cgs" between the gate potential and the source potential can be exclusively increased without having an effect on the capacitance "Cgd" between the gate potential and the drain potential, and therefore, the input capacitance "Ciss" can be exclusively increased without increasing the feedback capacitance "Crss". In this way, according to this embodiment, the ratio of the input capacitance "Ciss" to the feedback capacitance "Crss" can be efficiently further increased, and the possibility that charging and discharging of the capacitances cause the voltage at the gate electrodes to increase to lead to malfunction can be further reduced.

Furthermore, according to this embodiment, the arrangement involving the capacitances can be easily designed without having an effect on other characteristics, such as the threshold voltage or the withstanding voltage, and without increasing the on-resistance.

Furthermore, according to this embodiment, the input capacitance "Ciss" can be further increased than in the first embodiment. Therefore, even if the super junction structure is adopted, a serge voltage can be more effectively prevented from occurring when a switch is turned off.

Figure 5:
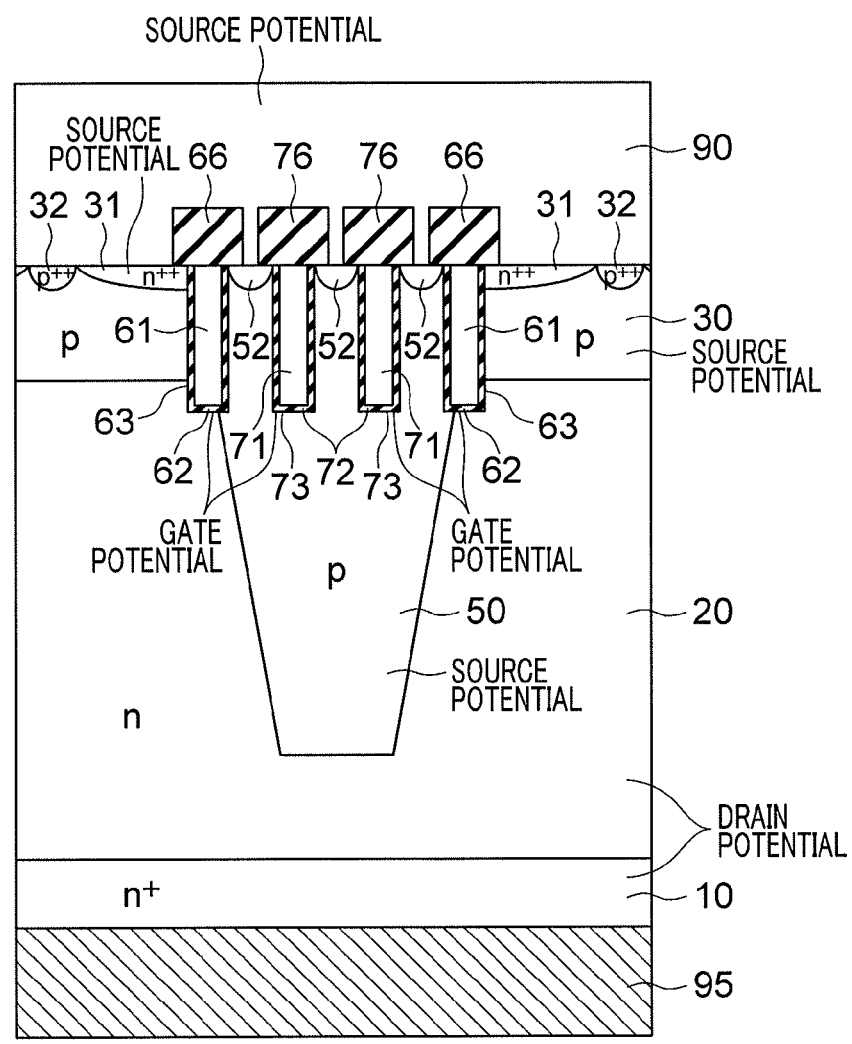
FIG. 5 is a side cross-sectional view showing a cross section of a semiconductor device according to a modification of the second embodiment of the present invention.

Although FIG. 4 shows only one second insulating layer 72 and one second gate electrode 71 provided between the pair of first gate electrodes 61, a plurality of second insulating layers 72 and a plurality of second gate electrodes 71 may be provided between the pair of first gate electrodes 61 as shown in FIG. 5. If a plurality of second insulating layer 72 and a plurality of second gate electrodes 71 are provided, the total area between the column layer 50 and the second gate electrodes 71 that are at the gate potential via the second insulating layers 72 increases, and the capacitance "Cgs" between the gate potential and the source potential further increases. Therefore, the ratio of the input capacitance "Ciss" to the feedback capacitance "Crss" can be further increased, and the possibility that charging and discharging of the capacitances cause the voltage at the gate electrodes to increase to lead to malfunction can be further reduced. In addition, even if the super junction structure is adopted, a serge voltage can be more reliably prevented from occurring when a switch is turned off.

Third Embodiment

Next, a third embodiment of the present invention will be described mainly with reference to FIGS. 6 to 8.

According to the third embodiment, in addition to the first gate electrode 61 and the first insulating layer 62 according to the first embodiment, a third gate electrode 81 surrounded by a third insulating layer 82 is provided between two adjacent column layers 50. The third insulating layer 82 and the third gate electrode 81 are disposed in a third trench 83 that extends from the source region 31 into the drift layer 20. The third gate electrode 81 is also at the gate potential.

In addition, according to this embodiment, a third interlayer insulating film 86 is formed on an upper surface of the third gate electrode 81 and the third insulating layer 82. Viewed from above, the third gate electrode 81, the third insulating layer 82 and the third interlayer insulating film 86 are shaped in a striped pattern (see FIG. 7 for the third gate electrode 81 and the third insulating layer 82). FIG. 6 shows a cross section taken along the line VI-VI in FIG. 7.

The remainder of the configuration according to the third embodiment is substantially the same as the configuration according to the first embodiment. In the third embodiment, the same components as those in the first embodiment are denoted by the same reference numerals, and detailed descriptions thereof will be omitted.

This embodiment also has advantageous effects similar to those of the first embodiment. Since the advantageous effects have already been described in detail with regard to the first embodiment, the description of the advantageous effects of this embodiment will be focused only on those specific to this embodiment.

According to this embodiment, since the third gate electrode 81 is additionally provided, the channel width can be increased, so that the on-resistance can be reduced.

Figure 6:
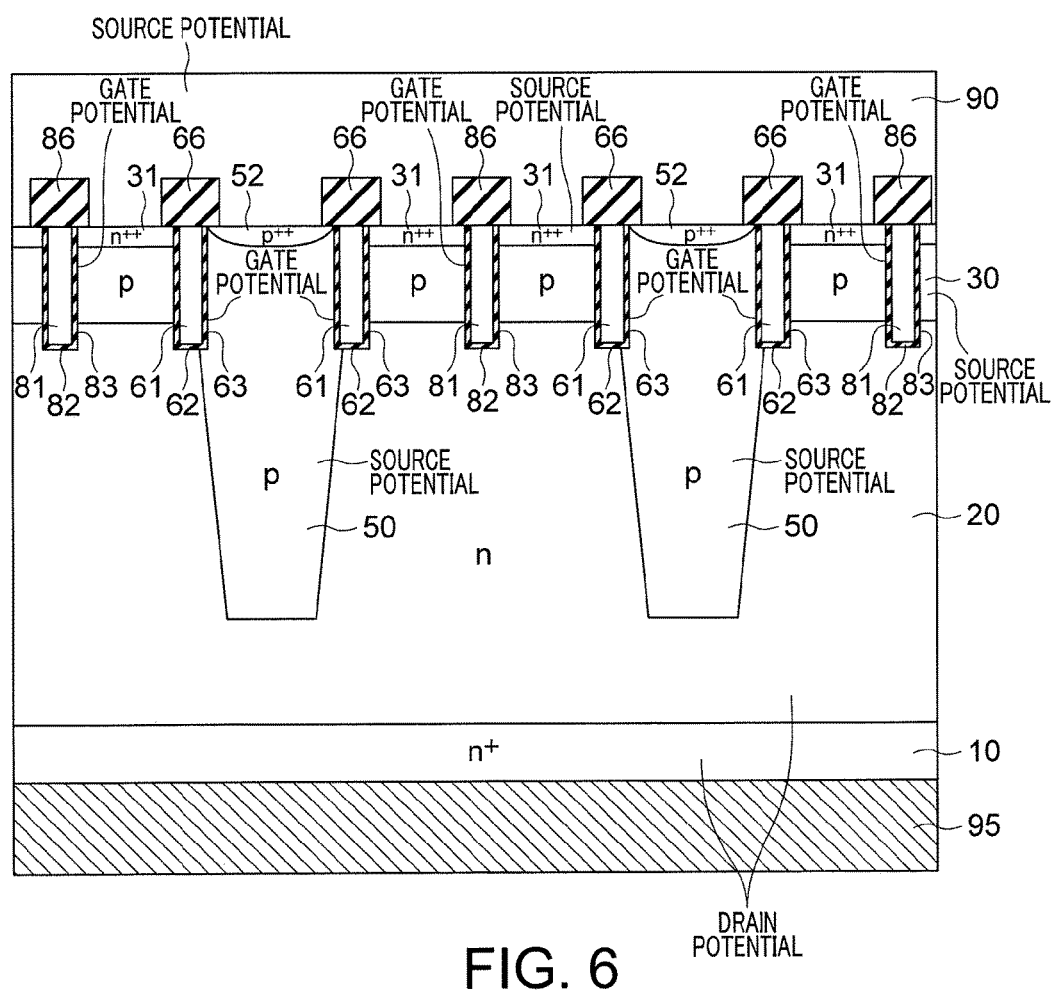
FIG. 6 is a side cross-sectional view showing a cross section of a semiconductor device according to a third embodiment of the present invention.
Figure 7:
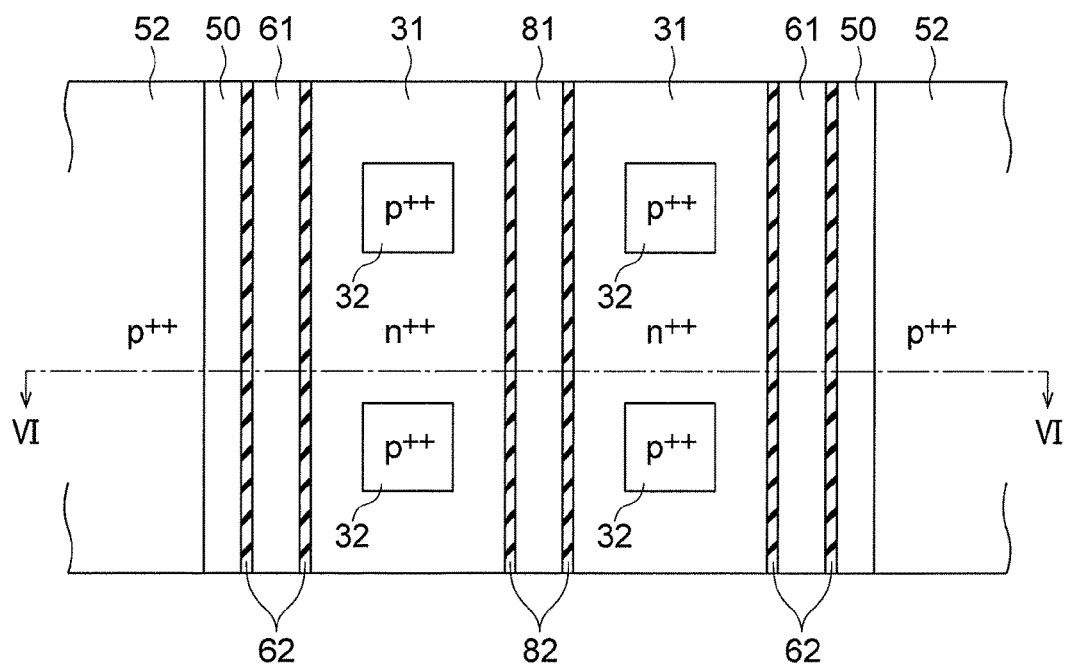
FIG. 7 is a top view of the semiconductor device according to the third embodiment of the present invention in which a source electrode and a first interlayer insulating film are omitted.
Figure 8:
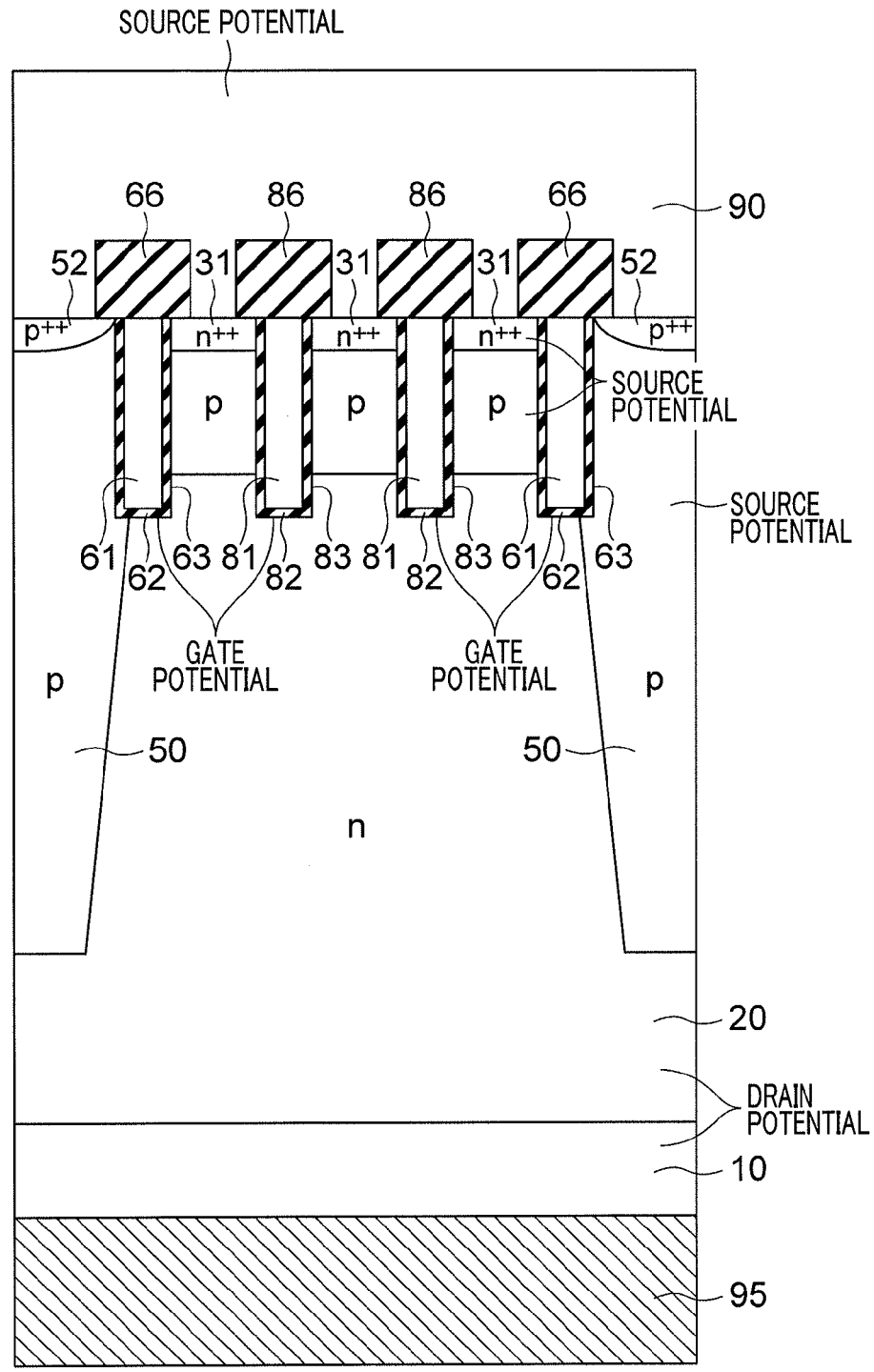
FIG. 8 is a side cross-sectional view showing a cross section of a semiconductor device according to a modification of the third embodiment of the present invention.

Although FIG. 6 shows only one third insulating layer 82 and one third gate electrode 81 provided between two adjacent column layers 50, a plurality of third insulating layers 82 and a plurality of third gate electrodes 81 may be provided between two adjacent column layers 50 as shown in FIG. 8. Since the plurality of third gate electrodes 81 are in contact with the base layer 30 via the third insulating layers 82 in a larger area than a single third gate electrode 81, the channel width increases, and the on-resistance can be further reduced.

Fourth Embodiment

Next, a fourth embodiment of the present invention will be described mainly with reference to FIGS. 9 and 10.

The fourth embodiment is a combination of the second embodiment and the third embodiment. That is, in addition to the first gate electrode 61 and the first insulating layer 62 according to the first embodiment, the second gate electrode 71 surrounded by the second insulating layer 72 is provided in the column layer 50 at an intermediate position in the horizontal direction between the pair of first gate electrodes 61, and the third gate electrode 81 surrounded by the third insulating layer 82 is provided between two adjacent column layers 50. The second insulating layer 72 and the second gate electrode 71 are disposed in the second trench 73 formed in the column layer 50, and the third insulating layer 82 and the third gate electrode 81 are disposed in the third trench 83 that extends from the source region 31 into the drift layer 20. Both the second gate electrode 71 and the third gate electrodes 81 are at the gate potential.

In addition, according to this embodiment, the second interlayer insulating film 76 is formed on the upper surface of the second gate electrode 71 and the second insulating layer 72. Viewed from above, the second gate electrode 71, the second insulating layer 72 and the second interlayer insulating film 76 according to this embodiment are shaped in a striped pattern. In addition, the third interlayer insulating film 86 is formed on the upper surface of the third gate electrode 81 and the third insulating layer 82. Viewed from above, the third gate electrode 81, the third insulating layer 82 and the third interlayer insulating film 86 according to this embodiment are shaped in a striped pattern.

The remainder of the configuration according to the fourth embodiment is substantially the same as the configuration according to the first embodiment. In the fourth embodiment, the same components as those in the first embodiment are denoted by the same reference numerals, and detailed descriptions thereof will be omitted.

This embodiment also has advantageous effects similar to those of the first embodiment. Since the advantageous effects have already been described in detail with regard to the first embodiment, the description of the advantageous effects of this embodiment will be focused only on those specific to this embodiment.

According to this embodiment, in addition to the first gate electrode 61 that is surrounded by the first insulating layer 62 and is at the gate potential, the second gate electrode 71 that is surrounded by the second insulating layer 72 and is at the gate potential and the third gate electrode 81 that is surrounded by the third insulating layer 82 and is at the gate potential are provided. As described above with regard to the second embodiment, since the second gate electrode 71 is provided, the capacitance "Cgs" between the gate potential and the source potential can be exclusively increased. Furthermore, as described above with regard to the third embodiment, since the third gate electrode 81 is provided, the channel width can be increased, and the on-resistance can be reduced. Therefore, according to this embodiment, the possibility that charging and discharging of the capacitances cause the voltage at the gate electrodes to increase to lead to malfunction can be reduced to the same extent as in the second embodiment, and the on-resistance can be reduced to the same extent as in the third embodiment.

Furthermore, according to this embodiment, the arrangement involving the capacitances can be easily designed without having an effect on other characteristics, such as the threshold voltage or the withstanding voltage, and without increasing the on-resistance.

Furthermore, according to this embodiment, the input capacitance "Ciss" can be increased to the same extent as in the second embodiment. Therefore, even if the super junction structure is adopted, a serge voltage can be further prevented from occurring when a switch is turned off.

Figure 9:
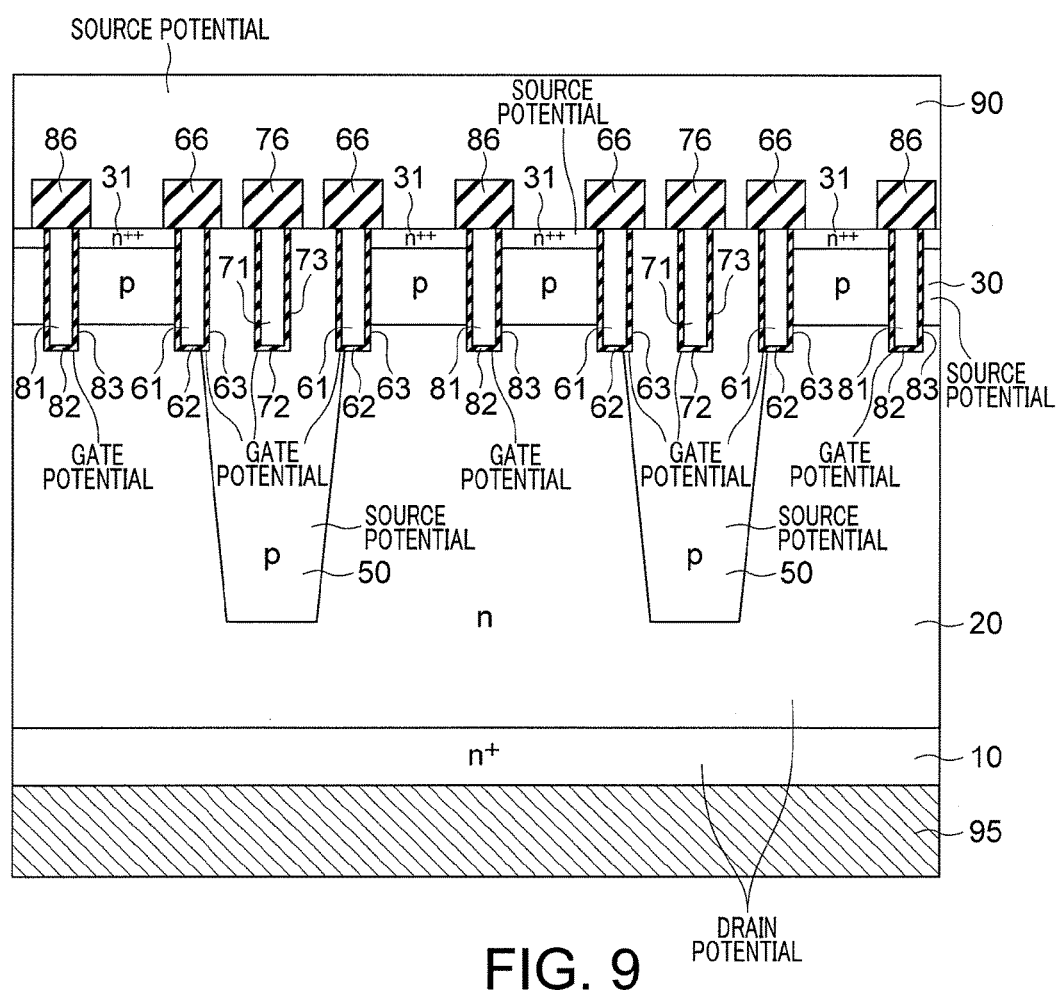
FIG. 9 is a side cross-sectional view showing a cross section of a semiconductor device according to a fourth embodiment of the present invention.
Figure 10:
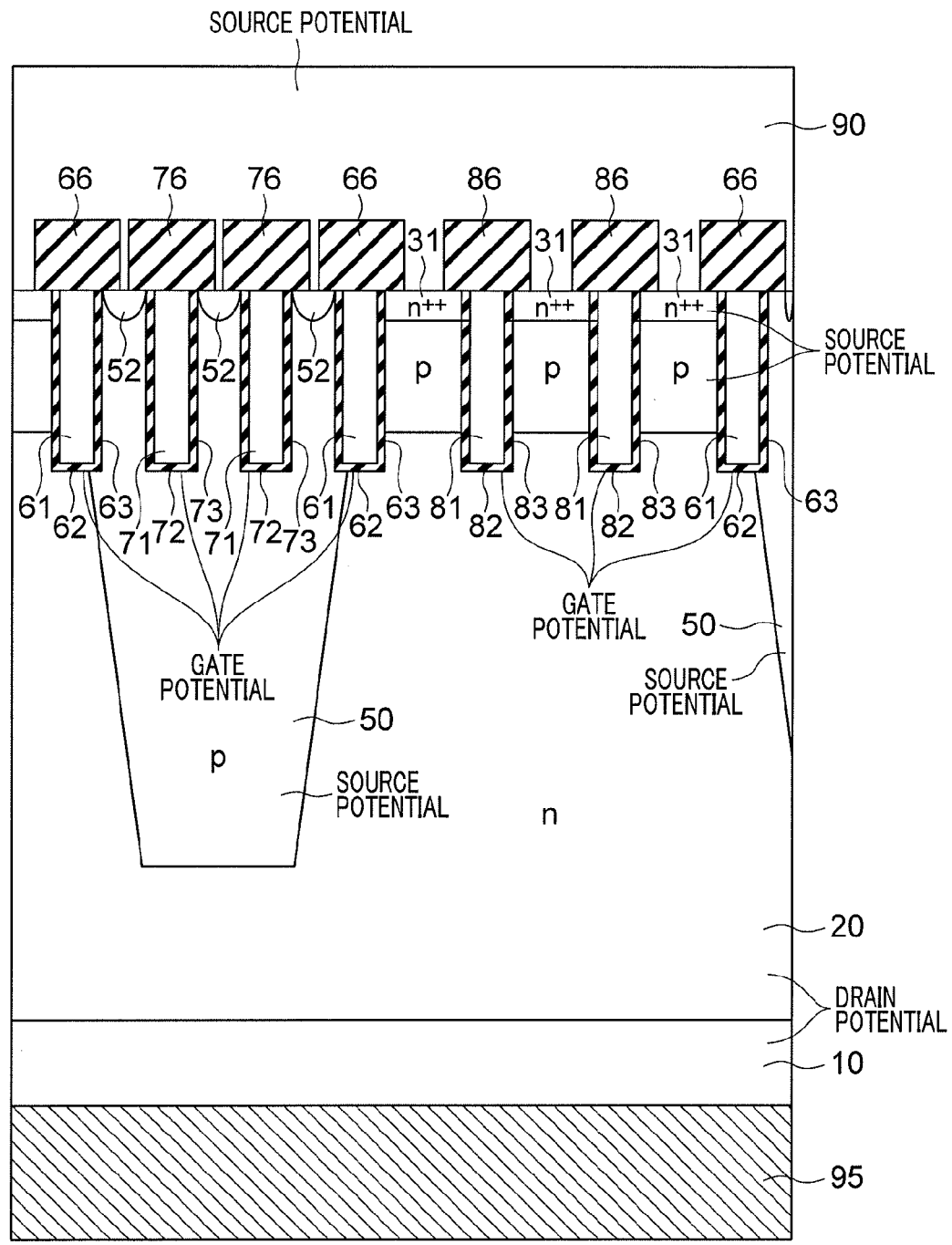
FIG. 10 is a side cross-sectional view showing a cross section of a semiconductor device according to a modification of the fourth embodiment of the present invention.

Although FIG. 9 shows only one second insulating layer 72 and one second gate electrode 71 provided between the pair of first gate electrodes 61 and only one third insulating layer 82 and one third gate electrode 81 provided between two adjacent column layers 50, the present invention is not limited to this implementation, a plurality of second insulating layers 72 and a plurality of second gate electrodes 71 may be provided between the pair of first gate electrodes 61, or a plurality of third insulating layers 82 and a plurality of third gate electrodes 81 may be provided between two adjacent column layers 50. Furthermore, as shown in FIG. 10, a plurality of second insulating layers 72 and a plurality of second gate electrodes 71 may be provided between the pair of first gate electrodes 61, and a plurality of third insulating layers 82 and a plurality of third gate electrodes 81 may be provided between two adjacent column layers 50.

If a plurality of second insulating layer 72 and a plurality of second gate electrodes 71 are provided, the ratio of the input capacitance "Ciss" to the feedback capacitance "Crss" can be further increased, and the possibility that charging and discharging of the capacitances cause the voltage at the gate electrodes to increase to lead to malfunction can be further reduced. In addition, even if the super junction structure is adopted, a serge voltage can be more reliably prevented from occurring when a switch is turned off. In addition, the on-resistance can be further reduced.

Finally, the embodiments described above and shown in the drawings are given only as examples for the purpose of illustration of the present invention set forth in the claims and do not limit the present invention set forth in the claims.

REFERENCE SIGNS LIST 20 drift layer
30 base layer
50 column layer
61 first gate electrode
62 first insulating layer
63 first trench
71 second gate electrode
72 second insulating layer
73 second trench
81 third gate electrode
82 third insulating layer
83 third trench
90 source electrode

What is claimed is:

1. A semiconductor device, comprising:
a drift layer of a first conductivity type;
a base layer of a second conductivity type that is disposed on the drift layer and is connected to a source electrode;
a column layer of a second conductivity type that is connected to the source electrode and penetrates the base layer to extend into the drift layer;
a pair of first gate electrodes surrounded by a first insulating layer disposed in a pair of first trenches provided on opposite sides of an upper end of the column layer;
a source region of the first conductivity type that is provided in the base layer, is adjacent to the first insulating layer on a side of the first insulating layer opposite to the column layer, and is connected to the source electrode; and
a second gate electrode surrounded by a second insulating layer that is disposed in a second trench formed in the column layer between the pair of first gate electrodes in a horizontal direction
wherein a depth of the first trench is equal to a depth of the second trench,
a sidewall of the first trench on a side of the column layer is embedded inside the column layer, and
a plurality of second insulating layers and a plurality of second gate electrodes are provided.

2. The semiconductor device according to claim 1, wherein the column layer and the drift layer repeatedly occur in the horizontal direction to form a super junction structure.

3. The semiconductor device according to claim 1, wherein a plurality of column layers are provided, and
the semiconductor device further comprises a third gate electrode surrounded by a third insulating layer that is disposed between adjacent two of the column layers and is disposed in a third trench that extends from the source region to the drift layer.

4. The semiconductor device according to claim 1, wherein a plurality of column layers are provided, and
the semiconductor device further comprises:
a third gate electrode surrounded by a third insulating layer that is disposed between adjacent two of the column layers and is disposed in a third trench that extends from the source region to the drift layer.

5. The semiconductor device according to claim 3, wherein a plurality of third insulating layers and a plurality of third gate electrodes are provided.

6. The semiconductor device according to claim 4, wherein a plurality of second insulating layers and a plurality of second gate electrodes are provided, and a plurality of third insulating layers and a plurality of third gate electrodes are provided.

7. The semiconductor device according to claim 1, wherein
a side surface of the first trench on a side opposite to the column layer is located in the source region, the base layer and the drift layer.

* * * * *